United States Patent [19]

Retallick et al.

[11] Patent Number: 5,213,840
[45] Date of Patent: May 25, 1993

[54] METHOD FOR IMPROVING ADHESION TO POLYMIDE SURFACES

[75] Inventors: Richard C. Retallick, West Hartford; Raymond A. Letize, West Haven; Peter E. Kukanskis, Woodbury, all of Conn.

[73] Assignee: MacDermid, Incorporated, Waterbury, Conn.

[21] Appl. No.: 713,638

[22] Filed: Jun. 10, 1991

Related U.S. Application Data

[63] Continuation of Ser. No. 517,154, May 1, 1990, abandoned.

[51] Int. Cl.[5] .............................................. C23C 26/00
[52] U.S. Cl. .......................................... 427/97; 427/98
[58] Field of Search ...................................... 427/97, 98

[56] References Cited

U.S. PATENT DOCUMENTS

| | | | |
|---|---|---|---|
| 4,209,331 | 6/1980 | Kukanskis et al. | 106/1.23 |
| 4,279,948 | 7/1981 | Kukanskis | 427/305 |
| 4,287,253 | 9/1981 | Leech | 427/98 |
| 4,374,868 | 2/1983 | Stahl | 427/97 |
| 4,425,380 | 1/1984 | Nuzzi | 427/97 |
| 4,515,829 | 8/1985 | Deckert | 427/97 |
| 4,576,689 | 3/1986 | Makkaev | 427/97 |
| 4,592,852 | 6/1986 | Courduvells | 252/79.1 |
| 4,597,988 | 7/1986 | Kukanskis | 427/97 |
| 4,629,636 | 12/1986 | Courduvelis | 427/98 |
| 4,668,532 | 5/1987 | Moisan | 427/98 |
| 4,725,504 | 2/1988 | Knudsen | 428/458 |
| 4,751,106 | 6/1988 | Wilkinson | 427/97 |
| 4,756,930 | 7/1988 | Kukanskis | 427/97 |
| 4,800,461 | 1/1989 | Dixon | 427/97 |
| 4,820,548 | 4/1989 | Courduvelis | 427/98 |
| 4,832,799 | 5/1989 | Knudsen | 204/22 |
| 4,842,946 | 6/1989 | Foust | 428/458 |
| 4,863,758 | 9/1989 | Rhodenizer | 427/97 |
| 4,873,122 | 10/1989 | Darken | 427/96 |
| 4,873,136 | 10/1989 | Foust | 428/209 |
| 4,874,635 | 10/1989 | Karas | 427/96 |
| 4,895,739 | 1/1990 | Bladon | 427/97 |

FOREIGN PATENT DOCUMENTS

| | | |
|---|---|---|
| 267452 | 5/1988 | European Pat. Off. ............. 427/97 |
| 88960 | 8/1978 | Japan ................................... 427/98 |
| 9459 | 1/1980 | Japan ................................... 427/98 |
| WO85/05755 | 12/1985 | PCT Int'l Appl. . |
| WO89/10431 | 11/1989 | PCT Int'l Appl. . |
| 1479556 | 7/1977 | United Kingdom . |

OTHER PUBLICATIONS

Kukanskis, Improved Smear Removal, Mar. 1983.
R. Cannizzaro "Application of Polyimide Materials in Electronic Circuitry" Solid State Technology, Nov. 1969, pp. 31–38.
John Davey "Plasma desmearing" Finishing Industries, Aug., 1981, pp. 33–34.

*Primary Examiner*—Michael Lusigan
*Assistant Examiner*—Vi Duong Dang
*Attorney, Agent, or Firm*—St. Onge Steward Johnston & Reens

[57] ABSTRACT

The adhesion between surfaces of polyimide, particularly the through hole surfaces of polyimide-based multilayer laminates used in the fabrication of multilayer printed circuits, is improved by pretreatment of the surfaces with an essentially non-alkaline aqueous permanganate solution.

15 Claims, No Drawings

METHOD FOR IMPROVING ADHESION TO POLYMIDE SURFACES

This is a continuation of copending application(s) Ser. No. 07/517,154 filed on May 1, 1990 now abandoned.

BACKGROUND OF THE INVENTION

The present invention relates to the electroless metallization of polyimide surfaces, more particularly to a method for improving electroless metal adhesion to a polyimide surface, and still more particularly to the electroless copper metallization of through-hole surfaces in multilayer printed circuit boards composed of polyimide insulating substrate material.

In the fabrication of multilayer printed circuits, i.e., printed circuits composed of a sandwich-like arrangement of alternating layers of circuitry and insulating substrate material, metallized through holes are provided in order to conductively interconnect the innerlayer circuitries as well as circuitry present on the outer-facing surfaces of the multilayer arrangement.

Ideally, the metal coating applied to the through hole surfaces should be complete in its coverage of the surfaces and should remain firmly adherent thereto throughout later fabrication steps, and in use of the printed circuit, so as to provide the desired electrical integrity in the completed printed circuit. To this end, and particularly for multilayer printed circuits in which the insulating material is epoxy-based (e.g., glass-reinforced epoxy resin), electroless metallization (e.g., electroless copper) is used to metallize the through holes, and steps are taken to prepare the through holes for complete and adherent receipt of the electroless metal deposit and electrical integrity among circuitry layers.

One such through hole preparation step is a so-called desmearing step, designed to remove from the exposed edges of the innerlayer circuitry epoxy resin smeared thereon as a consequence of the high-speed hole drilling operation and which otherwise would interpose a dielectric layer between those edges and the electroless metal deposit. Also known are so-called etch back procedures designed to maximize exposure of the innerlayer circuitry edges at the hole surfaces, as well as processes designed to improve the topography of the epoxy resin at the through hole surfaces so as to improve the ability of those surfaces to adherently receive the electroless metal deposit.

Reference may be had to U.S. Pat. Nos. 4,597,988 and 4,756,930 of Kukanskis, et al. in this regard, as well as Kukanskis, "Improved Smear Removal", CIRCUITS MANUFACTURING, March, 1983.

In recent years, polyimide and/or polyimide-containing materials have found increasing use as the insulating substrate material in printed circuits, offering excellent properties in terms of strength, thermal resistance, dimensional stability, and the like. At the same time, however, it has been recognized that these polyimide-based substrates are not particularly conducive to metallization, and in particular are difficult substrates on which to adhere an electroless metal deposit. Indeed, in recognition of this problem, IPC specifications for plated through holes in multilayer printed circuits employing polyimide substrates are quite relaxed, allowing up to 40% of the hole surface to exhibit hole wall pullaway (i.e., pulling away of the electroless metal deposit from the plated hole surface) so long as electrical integrity remains intact. Notwithstanding this foregiving specification, its attainment is often difficult to achieve and, more importantly, there is significant advantage to the fabricator and end user in achieving improved adhesion beyond that minimally specified.

Reference can be had to U.S. Pat. Nos. 4,842,946 and 4,873,136 of Foust, et al. for attempts to increase the adhesion of conductive metal to polyimide substrates, as well as to U.S. Pat. Nos. 4,725,504 and 4,832,799 to Knudsen, et al.

SUMMARY OF THE INVENTION

The primary object of the present invention is to provide a process for treating through holes formed in a multilayer printed circuit, in which the insulating substrate material is composed of polyimide, so as to improve the adhesion of electroless metal to the through hole surface.

Another object of the invention is to provide a process for electrolessly metallizing through holes formed in multilayer printed circuits in which the insulating substrate material is composed of polyimide.

Yet another more general object of the present invention is to provide a process for improving the adhesion of electrolessly deposited metal to insulating substrate material composed of polyimide.

In accordance with the primary object of the invention, the through holes of a multilayer printed circuit in which the insulating substrate material is composed of polyimide are subjected to a desmearing and/or etch back process effective to remove resin smear from the edges of innerlayer circuitry exposed at the through hole surfaces, and/or to etch back the insulating substrate material at the hole surfaces so as to maximize the exposure of innerlayer circuitry edges, all in accordance with generally conventional means. Thereafter, the desmeared and/or etched back through holes are contacted with an essentially non-alkaline permanganate solution, i.e., a permanganate solution having pH of no more than about 10, for a predetermined time effective to cause the hole surfaces to become more receptive to adherent receipt of electroless metal deposit, followed by treatment of the through hole surfaces to neutralize any residual manganese species.

The thus-treated through hole surfaces can then be metallized using known electroless metallization processes, e.g., involving activation of the hole surfaces with species catalytic to electroless deposition, followed by contact thereof with an electroless metal depositing bath, typically and preferably an electroless copper bath, and most preferably an electroless copper bath based upon hypophosphite reducing agents and having a pH of less than about 10.

Through holes prepared in this manner exhibit excellent adhesion of the electroless metal deposit, such that hole wall pullaway is significantly minimized, and thus greatly expands the potential for using polyimide-based insulating substrate material in the fabrication of multilayer printed circuits.

As regards the more general aspects of the invention, a process is provided for improving the adhesion of electroless metal to polyimide-based substrates, in which the substrate, prior to metallization, is contacted with an essentially non-alkaline permanganate solution as above described, followed by neutralization of any residual manganese species.

DETAILED DESCRIPTION OF THE INVENTION

The insulating substrate materials subjected to surface treatment prior to electroless metallization according to the invention are those consisting of and/or containing polyimide. Polyimides per se are well-known in the art, and are described, for example, in the Kirk-Othmer Encyclopedia of Chemical Technology, Third Edition, Volume 18, as well as in the earlier mentioned patents of Foust, et al. and Knudsen, et al., U.S. Pat. Nos. 3,983,093 and 4,360,633 to Williams III, et al. and Bolon, et al., respectively, and in U.S. Pat. Nos. 3,179,614 and 3,179,634 to Edwards. The insulating substrate material can be composed entirely of polyimide as the polymeric material or, alternatively, can contain polyimide along with other polymeric materials such as epoxy, either as mixtures, copolymers or the like. Generally, the polyimide-containing insulating substrate material will contain fillers and/or reinforcing agents, such as glass fibers, glass spheres, talcs, mica, silicates, carbon black, calcium carbonates, carbon fibers and the like, and may also contain various other additives such as pigments, plasticizers, impact modifiers, stabilizers and the like.

For use in the fabrication of printed circuit boards, the insulating substrate material preferably will be glass-reinforced polyimide or glass-reinforced polyimide/epoxy copolymer.

In the fabrication of multilayer printed circuits, alternating layers of circuitry and insulating substrate material are provided in the form of a laminate or sandwich, and through holes are punched or drilled at predetermined areas, such that the through hole surfaces consist of alternating layers of insulating substrate material and exposed edges of innerlayer circuitry.

According to the invention, these through hole surfaces are treated prior to their metallization. The first step in the pretreatment sequence is a step generally referred to in the art as desmearing, i.e., designed to remove from the exposed edges of innerlayer circuitry the resin smear present thereon as a consequence of local softening and flow of insulating substrate material in the hole forming operating. A variety of such desmearing treatments are known in the art and useful herein, including mechanical means such as vapor honing, chemical means such as sulfuric acid or chromic acid, and plasma etching. Particularly with chemical means, the desmearing generally is accompanied by an etching back of the resin surface in the hole thereby exposing additional edges and areas of the innerlayer circuitry. Accordingly, reference is made herein to "desmearing and/or etch-back" steps or techniques in recognition of the fact that certain techniques effect both functional results.

Among the known chemical desmearing and/or etch back techniques is treatment with strongly alkaline permanganate, i.e., aqueous permanganate solutions containing sufficient alkali (e.g., sodium or potassium hydroxide) to achieve a working pH of about 13 or greater, sometimes preceded by treatment of the hole surfaces with a solvent which serves to render the resin smear more amenable to removal by the permanganate. See generally in this regard British Patent Specification No. 1,479,556, U.S. Pat. No. 4,425,380; Kukanskis, "Improved Smear Removal For Multilayer Circuit Boards", IPC Technical Paper No. 435 (October 1982); F. Tamaiuolo, et al., "Alkaline Permanganate Treatment In Etch-Back Processes", Trans. IMF, 1986, 64, 80; and U.S. Pat. Nos. 4,515,829; 4,592,852; and published PCT Patent Application No. WO 85/05755. Generally speaking, the foregoing patents and publications are directed to multilayer circuits utilizing epoxy as the insulating substrate material, but have at least some applicability to polyimide-based substrates. In general, desmearing techniques for polyimide-based multilayer boards require highly alkaline solutions, and typically a significant concentration of hydroxide. See in this regard published PCT Patent Application No. WO 89/10431 of Kukanskis, et al., disclosing admixtures of water, water-immiscible solvent and caustic for use in pretreatment of epoxy and/or polyimide through hole surfaces preparatory to desmearing and/or etch back with strongly alkaline permanganate. Caustic solutions alone also can be used to desmear and/or etch back through holes in polyimide-based multilayer printed circuits.

According to the invention, the desmeared and/or etched back through holes are then contacted with an aqueous permanganate solution which is essentially non-alkaline. In particular, the permanganate solution has a pH of 10 or less, more preferably a pH of from about 4 to 10, still most preferably a pH of from about 6 to 8, and more preferably an essentially neutral pH of about 7, and is substantially free of hydroxide.

Typically, the permanganate ion will be provided by readily available water-soluble sources thereof, e.g., sodium or potassium permanganate. The concentration of permanganate generally will be in the range of from about 20 to about 150 g/l, with optimum concentrations being dependent upon the source of permanganate, the conditions of treatment, and the particular composition of the insulating substrate material. Generally, potassium permanganate will be used at a level of from about 40 to 80 g/l, and sodium permanganate will be used at a level of from about 80 to 120 g/l.

The treatment of the desmeared and/or etched back through hole surfaces with non-alkaline permanganate typically will be carried out by immersion of the multilayer substrate in a vessel containing the solution. The solution temperature typically will be from about 100° F. to about 200° F., with the preferred temperature range being from about 140° F. to about 180° F. The contact time between the solution and the substrate will generally be from about 3 to about 20 minutes, and will depend, e.g., upon the permanganate concentration, solution temperature and substrate composition. The contacting is maintained for whatever period is necessary to bring about the improved adhesion between the through hole surfaces and the subsequent electroless metal deposit, and is easily determinable for any particular set of conditions given the ranges provided above and routine experimentation.

One of the significant advantages of the invention is the ability to employ essentially non-alkaline permanganate solutions in bringing about the key result of improving adhesion between polyimide surfaces and electroless metal deposits. High pH permanganate solutions (e.g., as used in desmearing and/or etch back and/or post-desmearing treatment processes) are quite unstable upon preparation and spontaneously decompose to form essentially non-useful manganate and manganese dioxide even when no work is being performed by the solution, and thus must be replenished and/or regenerated with frequency in order to obtain useful concentrations of permanganate therein. At the preferred solution pH's of the present invention, however, the solutions are quite stable and little if any permanganate is consumed unless work is being processed according to the invention.

Following the non-alkaline permanganate treatment, the through hole surfaces are typically rinsed with water and then treated to neutralize manganese residues, e.g., as by contact with a suitable solution of reducing agent such as hydroxylamine, sugars and the like.

The so-treated through holes are then metallized according to processes well-known in the art, and involving the essential steps of activating the surfaces with species catalytic to electroless deposition (e.g., using the conventional tin-palladium catalysts exemplified in U.S. Pat. Nos. 3,011,920 and 3,532,518, followed if necessary by an acceleration step, or the organic acid-containing catalyst compositions disclosed in U.S. Pat. No. 4,863,758 of Rhodenizer, which do not require acceleration), followed by immersion in an electroless copper depositing bath. The compositions of such baths are well known in the art, and include a source of cupric ions, a reducing agent and a complexing agent. Baths based upon formaldehyde reducing agents can be employed, but it is preferred herein to employ hypophosphite-reduced electroless copper baths, such as disclosed in U.S. Pat. Nos. 4,209,331 and 4,279,948, which operate in essentially non-alkaline pH ranges.

Following electroless plating, the through hole containing multilayer boards are treated in conventional manner in fabricating printed circuits therefrom, including, for example, provision of additional copper on through hole and other surfaces (e.g., via electroplating); formation on the board surfaces of a desired pattern of conductive circuitry by application of patterned resist, etching, etc.; application of solder mask; and the like, all as well known in the art.

As previously noted, the treatment with non-alkaline permanganate according to the process of the present invention is particularly suitable for the fabrication of through hole-containing multilayer circuits in which the insulating substrate material is composed of polyimide, but also has applicability to the electroless metallization of any non-conductive surface composed of polyimide, be it for functional or decorative purposes. In this regard, the invention has particular applicability to the pre-electroless metallization treatment of polyimide surfaces which have previously been subjected to treatment steps involving relatively strong alkaline materials or solutions.

The following examples are provided in further illustration of the invention as applied to the metallization of through holes in multilayer printed circuits. In these examples, "hole wall pullaway" is used to define a condition where the electroless metal deposit has separated from the through hole surfaces, as measured visually (microphotographically) either after electroplating additional metal over the electrolessly metallized through holes or after the through holes have been both electroplated and subjected to solder shock (i.e., floating of the through holes on molten solder at 550° F. for 10 seconds).

EXAMPLE I

A multilayer laminate in which the insulating substrate material was a glass-reinforced polyimide/epoxy copolymer, was provided with drilled through holes and the through holes subjected to a plasma desmear in a vacuum chamber (80° C., 5000 W, 230 millitorr, 20 minutes). After the laminate had cooled, it was immersed in an aqueous neutral solution containing 100 g/l sodium permanganate (pH 8.2; 160° F.) for 5 minutes. The laminate was then rinsed and briefly immersed in a solution of hydroxylamine to neutralize manganese residues. The laminate surfaces were then catalyzed and electrolessly plated by immersion in a formaldehyde-reduced (pH 13.5) electroless copper bath (MacuDep 900, MacDermid, Inc., Waterbury, Conn.) to provide an electroless deposit of about 100 microinches on the through-hole surfaces. Acid copper was then electroplated over the electroless metal deposit to a total thickness of 1 mil. Through holes were sectioned and inspected via microphotography, and showed no evidence of hole wall pullaway. The same was true after solder shock of the through holes.

EXAMPLE II

The multilayer laminate used in Example I was provided with drilled through holes and desmeared and etched back by a process involving a first contact with a solution of water, butyl carbitol, ethylene glycol and sodium hydroxide, followed by a water rinse, and followed by contact with an aqueous alkaline solution of 60 g/l potassium permanganate (pH 13.25; 160° F.) for 10 minutes. Following this treatment, the through holes were immersed in an essentially neutral solution of 60 g/l potassium permanganate (pH 7.5; 160° F.) for 5 minutes. The surfaces were then neutralized and electrolessly and electrolytically plated as in Example I, and no hole wall pullaway was evident, even after solder shock.

By comparison, the foregoing sequence was exactly repeated but with omission of the treatment with neutral permanganate (manganese residues from the permanganate desmear were neutralized before metallization). Hole wall pullaway was evident after acid copper electroplating, and was even more significant after solder shock.

The process also was repeated using a pretreatment sequence of plasma desmear (see Example I) followed by the alkaline permanganate treatment solvent, high pH permanganate, rinse, neutralization), again with omission of the subsequent neutral permanganate treatment. Hole wall pullaway was evident after electroplating.

EXAMPLE III

A multilayer laminate in which polyimide is used as the insulating substrate material was provided with drilled through holes and desmeared/etched using a caustic solution. The laminate was then immersed in an aqueous neutral solution containing 100 g/l sodium permanganate (pH 7.8; 160° F.) for 5 minutes, water rinsed, and neutralized with hydroxylamine. The through hole surfaces were electrolessly copper plated using a hypophosphite-reduced (pH 9) bath (MacDermid 2490 Electroless Copper), followed by electrolytic acid copper. Sectioned through holes showed no hole wall pullaway even after solder shock.

The foregoing description and examples are provided in illustration of particular and preferred features of the invention, and are not intended as limiting the scope of the invention except as set forth in the appended claims.

What is claimed is:

1. In a process for preparing for electroless metallization the surfaces of through holes formed in a multilayer laminate comprised of alternating layers of conductive circuitry and insulating substrate material, and wherein said insulating substrate material is comprised of a polyimide, in which process the surfaces of said through holes are subjected to a desmearing and/or etchback treatment prior to electroless deposition, the improvement comprising contacting said through holes, after and separate from said desmearing and/or etch back treatment and prior to electroless metallization, with an aqueous permanganate solution having a pH of about 8 or less, for a time and at conditions effective to render the through holes more receptive to adherent receipt of subsequently-applied electroless metal, and thereafter neutralizing manganese residue on said through hole surfaces.

2. A process according to claim 1 wherein said aqueous permanganate solution has a pH in the range of from about 4 to about 8.

3. A process according to claim 2 wherein said aqueous permanganate solution has a pH in the range of from about 6 to 8.

4. A process according to claim 1 wherein said aqueous permanganate solution contains from about 20 to about 150 g/l of permanganate.

5. A process according to claim 4 wherein said contacting with said aqueous permanganate solution is at a solution temperature of from about 100° F. to about 200° F.

6. A process according to claim 1 wherein said insulating substrate material comprises glass-reinforced polyimide.

7. A process according to claim 1 wherein said insulating substrate material comprises glass-reinforced polyimide/epoxy co-polymer.

8. A process according to claim 1 wherein said desmearing and/or etch back comprises plasma desmearing.

9. A process according to claim 1 wherein said desmearing and/or etch back comprises contact of said through hole surfaces with an aqueous permanganate solution having a pH of at least 13.

10. A process for metallizing the through hole surfaces of a multilayer printed circuit laminate comprised of alternating layers of conductive circuitry and insulating substrate material comprised of polyimide, said process comprising the steps of:
   (a) treating said through hole surfaces to remove resin smear from exposed edges of conductive circuitry at the through hole surfaces and/or to etch back said insulating substrate material at the through hole surfaces;
   (b) thereafter contacting said through hole surfaces, in a step separate from said desmearing and/or etch back treatment, with an aqueous permanganate solution having a pH of about 8 or less;
   (c) thereafter neutralizing manganese residues on said through hole surfaces; and
   (d) thereafter electrolessly metallizing said through hole surfaces using an electroless copper plating bath.

11. A process according to claim 10 wherein said treatment of step (a) comprises contact of said through hole surfaces with an aqueous caustic solution.

12. A process according to claim 10 wherein said treatment of step (a) comprises subjecting said through hole surfaces to plasma desmearing.

13. A process according to claim 10 wherein said treatment of step (a) comprises contacting said through hole surfaces with an aqueous solution of permanganate having a pH of at least 13.

14. A process according to claim 10 wherein said electroless copper plating bath comprises a hypophosphite-reduced electroless copper plating bath having a pH of 10 or less.

15. A process according to claim 10 wherein, subsequent to step (d), said through hole surfaces are provided with a layer of electroplated copper.

* * * * *